United States Patent
She et al.

(10) Patent No.: US 10,710,111 B2
(45) Date of Patent: Jul. 14, 2020

(54) CONTINUOUS TOW FIBER COATING REACTOR

(71) Applicant: United Technologies Corporation, Farmington, CT (US)

(72) Inventors: Ying She, East Hartford, CT (US); John E. Holowczak, South Windsor, CT (US); Robert A. Barth, South Windsor, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 187 days.

(21) Appl. No.: 15/713,739

(22) Filed: Sep. 25, 2017

(65) Prior Publication Data
US 2019/0091718 A1 Mar. 28, 2019

(51) Int. Cl.
| | |
|---|---|
| *B05C 9/06* | (2006.01) |
| *B05C 19/04* | (2006.01) |
| *B05C 5/00* | (2006.01) |
| *B05C 5/02* | (2006.01) |
| *B05C 9/14* | (2006.01) |
| *B29B 15/14* | (2006.01) |
| *C23C 16/455* | (2006.01) |
| *C23C 16/54* | (2006.01) |
| *C04B 35/80* | (2006.01) |
| *D06M 23/08* | (2006.01) |

(52) U.S. Cl.
CPC ............ *B05C 9/06* (2013.01); *B05C 5/001* (2013.01); *B05C 5/0241* (2013.01); *B05C 9/14* (2013.01); *B05C 19/04* (2013.01); *B29B 15/14* (2013.01); *C23C 16/45506* (2013.01); *C23C 16/45591* (2013.01); *C23C 16/545* (2013.01); *C04B 35/80* (2013.01); *D06M 23/08* (2013.01)

(58) Field of Classification Search
None
See application file for complete search history.

(56) References Cited

U.S. PATENT DOCUMENTS

| | | | | |
|---|---|---|---|---|
| 3,106,480 | A | * | 10/1963 | Baker ................... B05C 1/0834 427/286 |
| 3,930,464 | A | * | 1/1976 | Wallsten ............. B05B 13/0207 118/122 |
| 4,096,823 | A | | 6/1978 | Schladitz |
| 4,580,524 | A | | 4/1986 | Lackey, Jr. et al. |
| 5,048,456 | A | | 9/1991 | Bouix et al. |
| 5,147,432 | A | * | 9/1992 | Edmonston ........... C03C 25/223 65/423 |
| 5,322,711 | A | | 6/1994 | Gabor et al. |
| 5,364,660 | A | | 11/1994 | Gabor et al. |

(Continued)

OTHER PUBLICATIONS

European search report for patent application No. 18196667.2-1103 dated Jan. 31, 2019.

*Primary Examiner* — Jethro M. Pence
(74) *Attorney, Agent, or Firm* — Bachman & LaPointe, PC

(57) ABSTRACT

A reactor for continuously coating tow fibers has an outer tubular member, an inner support member spaced from the outer tubular member, a reactant flowing through a space defined by the outer tubular member and the inner support member, and at least one flow promotor located on an outer surface of the inner support member for directing the reactant towards an inner surface of the outer tubular member. A system and a method for coating tow fibers are also described.

22 Claims, 2 Drawing Sheets

(56) References Cited

U.S. PATENT DOCUMENTS

| | | |
|---|---|---|
| 5,547,512 A | 8/1996 | Gabor et al. |
| 5,891,249 A | 4/1999 | Bieler et al. |
| 6,630,029 B2 | 10/2003 | Brun |
| 7,381,445 B2 | 6/2008 | Brun |
| 8,894,918 B2 | 11/2014 | Dicarlo et al. |
| 2002/0066409 A1 | 6/2002 | Brun et al. |
| 2004/0173597 A1 | 9/2004 | Agrawal et al. |
| 2007/0099527 A1 | 5/2007 | Brun et al. |
| 2011/0171399 A1 | 7/2011 | Brun et al. |
| 2015/0004393 A1 | 1/2015 | Pegna et al. |
| 2016/0096778 A1 | 4/2016 | Chamberlain et al. |
| 2016/0122252 A1 | 5/2016 | Garnier et al. |

\* cited by examiner

CONTINUOUS TOW FIBER COATING REACTOR

BACKGROUND

The present disclosure is directed to a continuous tow fiber coating reactor which may be used in a system for coating tow fibers and to a method for coating the tow fibers using the reactor.

Fiber reinforced ceramic matrix composite (CMC) materials are finding a greater number of applications in high temperature oxidizing environments due to their material properties including, but not limited to, high temperature and oxidation resistance, high strength and creep resistance, high thermal conductivity and low weight. One of the CMC materials considered for aerospace applications is the SiC fiber/SiC matrix CMC material in which unidirectional SiC fibers with a thin layer of boron nitride (BN) interface coating (typically less than 1.0 μm thick) are imbedded in a SiC matrix.

An advantage of CMC materials compared to their corresponding monolithic materials is that such materials are significantly tough even though their constituents may be intrinsically brittle. This feature is achieved by utilizing an appropriate fiber/matrix interface coating(s), such as BN, that arrest and deflect cracks formed under load in the brittle matrix and prevent early failure. Furthermore, the interface coatings protect the fibers from detrimental interactions with each other, with the matrix, and with the environment in the CMC component application(s). Therefore, interface coatings play an important role in the performance and lifetime of CMC materials during their applications.

Boron nitride has potential as an interface coating material because it has low shear strength and good oxidation resistance capability. A typical process to perform BN interface coatings on SiC fiber tows is through chemical vapor deposition (CVD) via either a continuous tow coating or a batch process. In the continuous tow process, a single tow or multiple tows is/are pulled through a cylindrical or slot shaped BN CVD reactor where the reactants are fed into the reactor via co-feed or counter feed mode with respect to the tow travel direction, achieving the interface coatings on the tows.

An issue in the continuous tow interface coating process is that there is lack of a means to enhance the reactant distribution and associated mass transfer between the filaments and the reactants inside the reactor. Some have used disruptors attached to an inner wall of a single tube reactor to disturb reactant flow inside the reactor to enhance the mass transfer. Despite this, there remains a need to enhance the mass transfer so as to improve interface coatings on the fibers.

SUMMARY

In accordance with the present disclosure, a reactor for continuously coating tow fibers, broadly comprises an outer tubular member, an inner support member spaced from the outer tubular member, a reactant flowing through a space defined by the outer tubular member and the inner support member, and at least one flow promotor located on an outer surface of the inner support member for directing the reactant towards an inner surface of the outer tubular member.

In another and alternative embodiment, the reactor may comprise the at least one flow promoter circumferentially surrounding the inner support member.

In another and alternative embodiment, the reactor may comprise a plurality of flow promoters spaced along the inner support member.

In another and alternative embodiment, the reactor may comprise a plurality of flow promoters equally spaced along the inner support member.

In another and alternative embodiment, the reactor may comprise a plurality of flow promotors having a spacing therebetween which decreases from a first end to a second end of the inner support member.

In another and alternative embodiment, the reactor may comprise a plurality of flow promoters having a spacing therebetween which increases from a first end to a second end of the inner support member.

In another and alternative embodiment, the reactor may comprise the outer tubular member and the inner support member extending along an axis, a first end plate member having a reactant inlet for introducing the reactant into the space between the outer tubular member and the inner support member, the reactant inlet extending parallel to the axis, and a second end plate having an outlet for exhausting the reactant.

In another and alternative embodiment, the reactor inlet and outlet may be coaxial with the axis and the outlet may extend parallel to the axis.

In another and alternative embodiment, the reactor may further comprise a plurality of openings in the first and second end plates for allowing a plurality of tow fibers, or more than two, to pass through the space between the outer tubular member and the at least one flow promoter.

In another and alternative embodiment, the at least one flow promoter may have a surface angled to direct the reactant toward the inner surface of the outer tubular member so that the reactant contacts the inner surface and bounces off the inner surface, thereby creating turbulence in the reactant.

In another and alternative embodiment, the at least one flow promotor may induce one of a swirl and tumble in the reactant flow.

In another and alternative embodiment, the reactor may have a first central axis and the outer tubular member and said inner support member each have a second central axis collinear with the first central axis.

Further in accordance with the present disclosure, a system for continuously coating tow fibers broadly comprises a reactor comprising an outer tubular member, an inner support member spaced from the outer tubular member, a reactant flowing through a spaced defined by the outer tubular member and the inner support member, and at least one flow promoter located on an outer surface of the inner support member for directing the reactant towards an inner surface of the outer tubular member, and which further broadly comprises a plurality of take-off spools and take-up spools for causing a plurality of tow fibers to travel through the reactor.

In another and alternative embodiment, the system may further comprise a heat source for heating the reactant within the reactor.

In another and alternative embodiment, the reactant may flow in a first direction and the plurality of tow fibers may move in a second direction counter to the first direction.

In another and alternative embodiment, the system may have the reactant flowing in a first direction and the plurality of tow fibers also moving through the reactor in the first direction.

In another and alternative embodiment, the at least one flow promoter may comprise a plurality of flow promotors spaced along the inner support member and each of the flow promoters may circumferentially surround the inner support member and may have a surface angled so that the reactant is directed towards the inner surface of the outer tubular member.

Still further in accordance with the present disclosure, a method for coating a plurality of tow fibers broadly comprises the steps of providing a reactor comprising an outer tubular member, an inner support member spaced from the outer tubular member, a reactant flowing through a space defined by the outer tubular member and the inner support member, and at least one flow promoter located on an outer surface of the inner support member for directing the reactant towards an inner surface of the outer tubular member, providing a plurality of take-off spools and take-up spools for causing a plurality of tow fibers to travel through the reactor, introducing the reactant into the reactor so that the reactant flows in a direction parallel to a central axis of the reactor, and passing the plurality of tow fibers through the reactor.

In another and alternative embodiment, the method may comprise the reactant introducing step comprising introducing the reactant into the reactor in a first direction and the tow fibers passing step comprising passing the tow fibers in a direction counter to the first direction.

In another and alternative embodiment, the method may comprise the reactant introducing step comprising introducing the reactant into the reactor in a first direction and the tow fibers passing step comprising passing the tow fibers through the reactor in the first direction.

In another and alternative embodiment, the method may further comprise forming multiple tow coatings on the tow fibers.

In another and alternative embodiment, the method may further comprise the reactor having a plurality of flow promotors and the reactant introducing step comprising introducing reactants separately at different stages of the flow promotors.

Other details of the reactor, system, and method for coating a plurality of tow fibers are set forth in the following detailed description and the accompanying drawings, wherein like reference numerals depict like elements.

DETAILED DESCRIPTION

Figure 1:
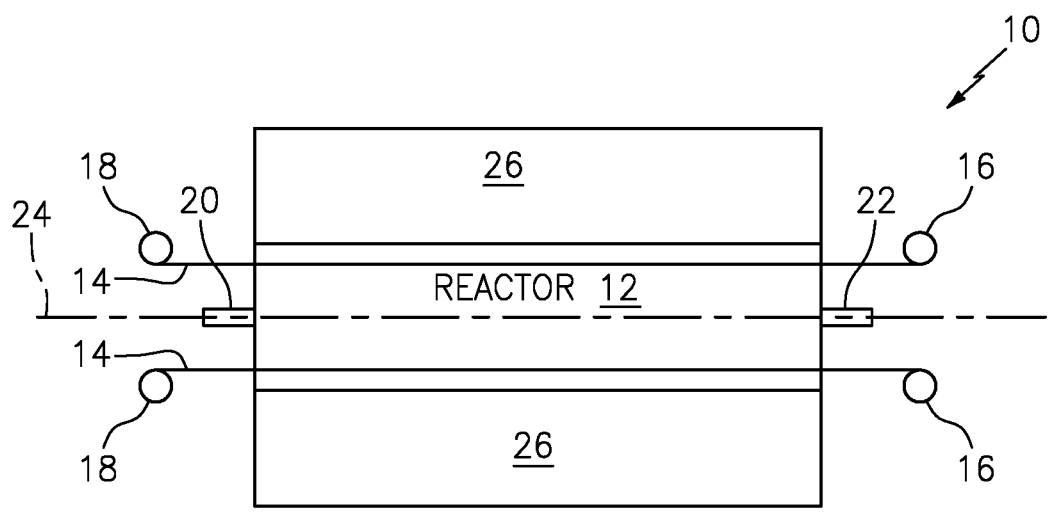
FIG. 1 is a schematic representation of a system for continuously coating tow fibers.

Referring now to FIG. 1, there is shown a system 10 for continuously coating tow fibers. The system 10 may comprise a reactor 12 through which a plurality of tow fibers 14 pass. The tow fibers 14 may come off a plurality of take-off spools 16 and may be gathered on a plurality of take-up spools 18. The tow fibers 14 may be single or multiple fiber tows. Reactant(s) may flow into the reactor 12 through an inlet 20 in a direction parallel to a central axis 24 of the reactor 12 and either counter to the movement of the tow fibers 14 through the reactor 12 or co-fed with the movement of the tow fibers 14 through the reactor 12. The reactant(s) may exit the reactor 12 through an exhaust outlet 22. The exhaust outlet 22 may also be parallel to the central axis 24. The reactor 12 may be in contact with, or positioned within, a heat source 26, such as a furnace. The heat source 26 may be at a temperature sufficient to decompose the reactant(s). The temperature may be in the range of from 700 degrees Centigrade to 1800 degrees Centigrade.

Figure 2:
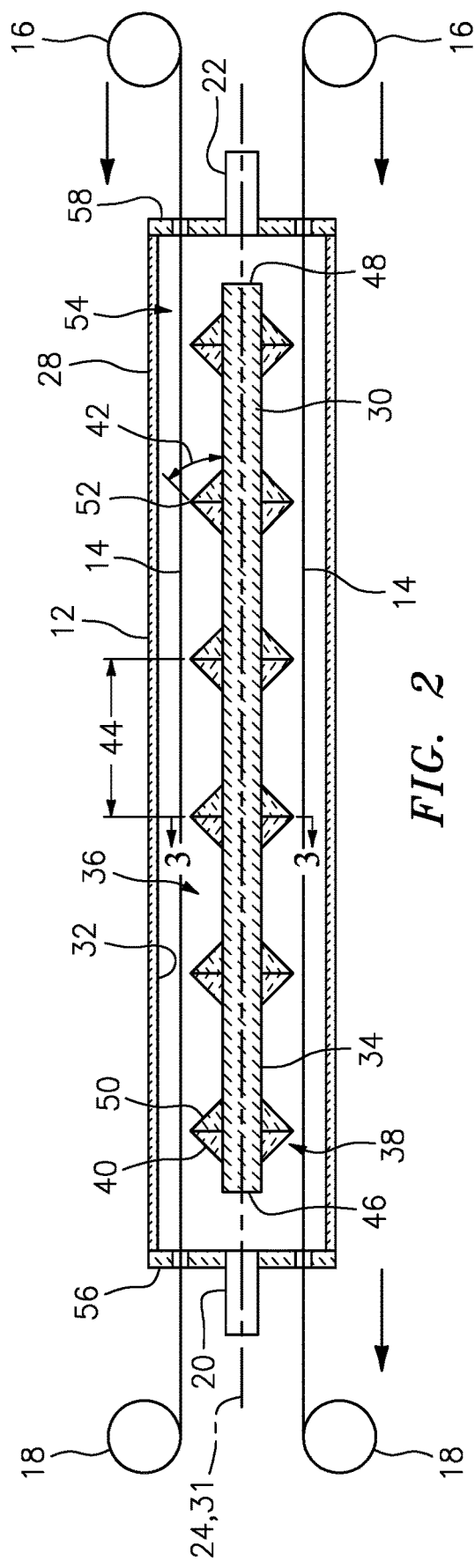
FIG. 2 is a sectional view of the reactor illustrated in FIG. 1.

Referring now to FIG. 2, it can be seen that the reactor 12 may comprise an outer tubing 28 and an inner support member 30. The inner support member 30 may be joined to the outer tubing 28 by a rod (not shown). The outer tubing 28 and the inner support member 30 may each have a central axis 31 which is collinear with the central axis 24. The inner support member 30 may be a solid tube or a hollow tube. The outer tubing 28 has an inner wall 32 and the inner support member 30 has an outer surface 34. A reactant flow channel 36 extends between the inner wall 32 and the outer surface 34.

Figure 3:
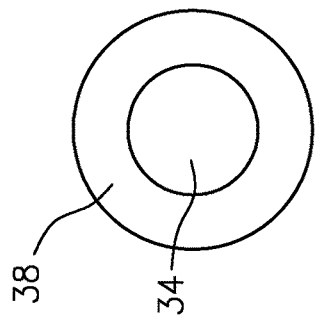
FIG. 3 is a sectional view taken along lines 3-3 of FIG. 2.

As can be seen from FIG. 2, a plurality of flow promotors 38 may be disposed along the outer surface 34 of the inner support member 30. The flow promotors 38, as can be seen in FIG. 3, may circumferentially surround the outer surface 34 of the inner support member 30. The flow promotors 38 may each have a first angled surface 40 which extends into the flow channel 36 so as to come into contact with the reactant(s) flowing in the flow channel 36. The angled surface 40 may have an angle 42 relative to the outer surface 34 such that reactant(s) contacting the angled surface 40 is directed towards the inner wall 32 and reflected by, or bounced back by, the inner wall 32 back into the flow channel 36. The angle 42, for example, may be 45 degrees.

The flow promotors 38 create a beneficial turbulent flow within the flow channel 36 which enhances the mass transfer between the filaments of the tow fibers 14 and the reactant(s) inside the reactor 12, and thereby enhances the interface coatings on the tow fibers 14. The flow promotors 38 change the flow direction of the reactant(s) so that the reactant(s) may flow through the tow fibers 14 when hitting a flow promoter 38 on the outer surface 34 of the inner support member 30 and flow through the tow fibers 14 again passing the flow promotor 38. The flow promotors 38 cause the reactant(s) to flow through the tow fibers 14 in the reactor back and forth during the coating process to enhance the mass transfer between the tow fibers 14 and the reactant(s). In this way, interface coatings can be made and the reactant(s) can be used more efficiently. Further, the flow promotors 38 allow the reactor 12 to operate at full (atmospheric) pressure.

The flow promotors 38 may be equally spaced along the length of the inner support member 30. Alternatively, the spacing 44 between the flow promotors may increase or decrease from a first end 46 of the inner support member 30 to a second end 48 of the inner support member 30. In this way, the turbulence of the reactant flow in the flow channel 36 may be altered in a desired way. The flow promotors 38 may be such that they induce a swirl or tumble in the reactant flow.

The flow promotors 38 may have a second angled surface 50 joined to the angled surface 42 to further help the creation of turbulent flow within the flow channel 36. The angled surfaces 42 and 50 may be linear or non-linear surfaces. The angled surfaces 42 and 50 create an apex 52 which with the inner wall 32 forms a space 54 within the flow channel 36 through which the tow fibers 14 may continuously pass without the tow fibers 14 contacting the flow promotors 38.

Figure 4:
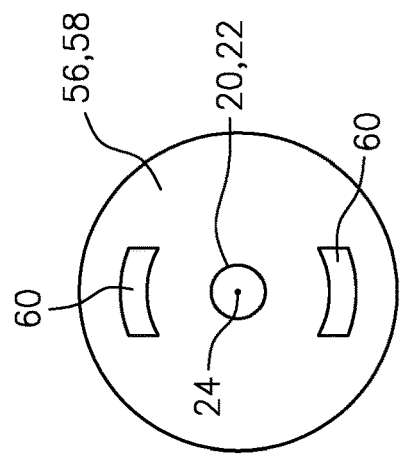
FIG. 4 is an end view of the reactor of FIG. 1.

Attached to the outer tubing 28 are end plates 56 and 58. The end plates 56 and 58 may be attached to the outer tubing 28 in any suitable manner, such as by an adhesive or by a threaded connection. As shown in FIG. 4, each end plate 56, 58 may have a plurality of openings 60 through which a plurality of tow fibers 14 may enter or exit the reactor. The number of openings 60 in each plate 56, 58 depends on the number of tow fibers 14 to be coated at the same time. While only two openings 60 have been illustrated in FIG. 4, there may be any desired number of openings 60 to accommodate any desired number of tow fibers 14. For example, there could be 6-8 openings 60 in each end plate 56, 58.

The end plate 56 has an integrally formed reactant inlet 20 which may be coaxial with or offset from the central axis 24 of the reactor 12. The reactant inlet 20 may extend parallel to the central axis 24 so as to create a reactant flow in a direction parallel to the central axis 24 and in either a counter feed or co-feed mode with respect to the direction of movement of the tow fibers 14 through the reactor 12.

The end plate 58 may have an integrally formed exhaust outlet 22 which may be coaxial with or offset from the central axis 24 of the reactor 12. The exhaust outlet 22 may also extend parallel to the central axis 24.

The outer tubing 28, the inner support member 30, the flow promotors 38, and the end plates 56 and 58 may all be formed from a ceramic material, including, but not limited to, quartz, silicon nitride, and graphite.

The tow fibers 14 to be coated may be fibers made from one of SiC, alumina, aluminum silicate, mullite, and silicon nitride, as well as from other materials. The tow fibers 14 can have a diameter of from 4 to 25 microns. The tow fibers 14 may contain from 2 to 12000 fibers, depending on fiber type, size and intended use.

The reactant(s) used in the reactor 12 is/are determined by the desired coating. Some coatings may be produced by decomposition of a single reactant gas. For example, deposition of carbon may be accomplished by decomposition of a hydrocarbon, such as methane. A two-gas reaction may be used for other coatings. For example, a boron trichloride and ammonia reaction may be used to form boron nitride. A three gas reaction such as boron trichloride, ammonia and a silicon precursor may be used to form a desired coating. Silicon precursors include dichlorosilane, trichlorosilane, silicon tetrachloride, and silane. Hydrogen or nitrogen may be used to dilute precursor gases to control reaction speed and temperature.

The thickness of the coating deposited on a fiber is dependent on such factors as fiber speed, reactor pressure, and reactant gas flow rate. The gas flow rate has to be sufficient to provide desired coating thickness on the fiber. The rate depends on the cross section of the reactor, number of fibers being coated, and their transport rate.

Reactor pressure determines how fast the reactant gas(es) decomposes.

The reactor 12 also allows for multiple tow coatings to be applied to the tow fibers 14 as the tow fibers 14 pass through the reactor.

Figure 5:
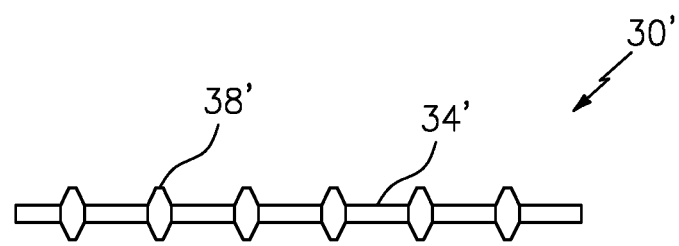
FIG. 5 is a view of an inner support member to be used in the reactor.

Referring now to FIG. 5, there is shown an embodiment of the inner support member 30'. In this embodiment, the inner support member 30' may be fabricated as a rod and then machined to have an outer surface 34' with a plurality of flow promotors 38'.

In use, the reactor 12 is placed within, or in contact with, the heat source 26. Reactant(s) may be allowed to flow into the reactor 12 via the inlet 20. As described above, the reactant(s) may flow through the reactor 12 in a direction counter to, or the same as, the direction of movement of the tow fibers 14. The tow fibers 14 are then continuously moved through the reactor 12 at a desired speed sufficient to create an interface coating on the tow fibers 14. The reactor 12 may be used to form multiple tow coatings during the process.

If desired, when multiple reactants are used, the reactants may be injected separately. For example, different reactants may be injected at different stages, wherein the spacing 44 between a pair of flow promotors 38 forms a stage. Additional reactant inlets may be provided at different stages to allow the injection of the reactants.

As can be seen from the above description, a continuous CVD interface coating system and method for the fabrication of CMC composite parts has been presented. The system and method described herein can improve the performance and lifetime of CMC materials during their applications due to the manner in which the interface coatings are formed on the tow fibers. The system and process described herein can allow improvements in the thickness distribution of interface coatings and potentially allow appropriate thicker coatings. The reaction rates in the system and method may result in achieving high precursor gas utilization, in increasing system and method capacity, and generating cost savings.

While the disclosure has been described with reference to exemplary embodiment(s), it will be understood by those skilled in the art that various changes may be made and equivalents may be substituted for elements thereof without departing from the scope of the disclosure. In addition, modifications may be made to adapt a particular situation or material to the teachings of the disclosure without departing from the scope thereof. Therefore, it is intended that the disclosure not be limited to the particular embodiment(s) disclosed, but that the disclosure will include all embodiments falling within the scope of the appended claims.

What is claimed is:

1. A reactor for continuously coating tow fibers, said reactor comprising:
    an outer tubular member;
    an inner support member spaced from said outer tubular member;
    a reactant flowing through a space defined by said outer tubular member and said inner support member; and
    at least one flow promotor located on an outer surface of said inner support member for directing said reactant towards an inner surface of said outer tubular member.

2. The reactor of claim 1, wherein said at least one flow promotor circumferentially surrounds said inner support member.

3. The reactor of claim 1, wherein said at least one flow promotor comprises a plurality of flow promotors spaced along said inner support member.

4. The reactor of claim 3, wherein said plurality of flow promotors are equally spaced along said inner support member.

5. The reactor of claim 3, wherein said plurality of flow promotors have a spacing therebetween which decreases from a first end to a second end of said inner support member.

6. The reactor of claim 3, wherein said plurality of flow promotors have a spacing therebetween which increases from a first end to a second end of said inner support member.

7. The reactor of claim 3, further comprising:
    said outer tubular member and said inner support member extending along an axis;
    a first end plate having a reactant inlet for introducing said reactant into said space between said outer tubular member and said inner support member;

said reactant inlet extending parallel to said axis; and
a second end plate having an outlet for exhausting said reactant.

8. The reactor of claim 7, wherein said reactant inlet and outlet are coaxial with said axis and said outlet extends parallel to said axis.

9. The reactor of claim 7, further comprising a plurality of openings in said first and second end plates for allowing a plurality of tow fibers to pass through said space between said outer tubular member and said at least one flow promotor.

10. The reactor of claim 1, wherein said at least one flow promotor has a surface angled to direct said reactant toward said inner surface of said outer tubular member so that said reactant contacts said inner surface and bounces off said inner surface, thereby creating turbulence in said reactant.

11. The reactor of claim 1, wherein said at least one flow promotor induces one of a swirl and tumble in said reactant flow.

12. The reactor of claim 1, wherein said reactor has a first central axis and said outer tubular member and said inner support member each have a second central axis collinear with the first central axis.

13. A system for continuously coating fiber tows, said system comprising:
a reactor comprising an outer tubular member, an inner support member spaced from said outer tubular member, a reactant flowing through a space defined by said outer tubular member and said inner support member, and at least one flow promotor located on an outer surface of said inner support member for directing said reactant towards an inner surface of said outer tubular member; and
a plurality of take-off spools and take-up spools for causing a plurality of tow fibers to travel through said reactor.

14. The system of claim 13, further comprising a heat source for heating said reactant within said reactor.

15. The system of claim 13, wherein said reactant flows in a first direction and said plurality of tow fibers move in a second direction counter to said first direction.

16. The system of claim 13, wherein said reactant flows in a first direction and said plurality of tow fibers move through said reactor in said first direction.

17. The system of claim 13, wherein said at least one flow promotor comprises a plurality of flow promotors spaced along said inner support member and wherein each of said flow promotors circumferentially surrounds said inner support member and has a surface angled so that said reactant is directed towards the inner surface of said outer tubular member.

18. A method for coating a plurality of tow fibers comprising:
providing a reactor comprising an outer tubular member, an inner support member spaced from said outer tubular member, a reactant flowing through a space defined by said outer tubular member and said inner support member, and at least one flow promotor located on an outer surface of said inner support member for directing said reactant towards an inner surface of said outer tubular member;
providing a plurality of take-off spools and take-up spools for causing a plurality of tow fibers to travel through said reactor;
introducing said reactant into said reactor so that said reactant flows in a direction parallel to a central axis of said reactor; and
passing said plurality of tow fibers through said reactor.

19. The method of claim 18, wherein said reactant introducing step comprises introducing said reactant into said reactor in a first direction and said tow fibers passing step comprises passing said tow fibers in a direction counter to said first direction.

20. The method of claim 18, wherein said reactant introducing step comprises introducing said reactant into said reactor in a first direction and said tow fibers passing step comprises passing said tow fibers through said reactor in said first direction.

21. The method of claim 18, further comprising forming multiple tow coatings on the tow fibers.

22. The method of claim 18, further comprising said reactor having a plurality of flow promotors and said reactant introducing step comprising injecting reactants separately at different stages of said flow promotors.

* * * * *